United States Patent [19]

Okaniwa et al.

[11] Patent Number: 4,697,041
[45] Date of Patent: Sep. 29, 1987

[54] INTEGRATED SOLAR CELLS

[75] Inventors: Hiroshi Okaniwa, Hachioji; Kenji Nakatani; Tetsuo Sato, both of Hino, all of Japan

[73] Assignee: Teijin Limited, Osaka, Japan

[21] Appl. No.: 828,197

[22] Filed: Feb. 10, 1986

[30] Foreign Application Priority Data

Feb. 15, 1985 [JP] Japan .................. 60-26426
Mar. 19, 1985 [JP] Japan .................. 60-53255
Apr. 19, 1985 [JP] Japan .................. 60-82172
May 15, 1985 [JP] Japan .................. 60-101540

[51] Int. Cl.$^4$ ............... H01L 27/14; H01L 31/18
[52] U.S. Cl. ..................... 136/244; 136/249; 136/258; 437/5; 437/173; 437/67
[58] Field of Search ........ 136/244, 249 MS, 258 AM; 29/572, 583, 591; 427/74, 75; 156/643; 219/121 LD, 121 LJ

[56] References Cited

U.S. PATENT DOCUMENTS

| | | | |
|---|---|---|---|
| 4,042,418 | 8/1977 | Biter | 136/249 MS |
| 4,243,432 | 1/1981 | Jordan et al. | 136/244 |
| 4,245,386 | 1/1981 | Kausche et al. | 29/572 |
| 4,428,110 | 1/1984 | Kim | 29/572 |
| 4,438,723 | 3/1984 | Cannella et al. | 118/718 |
| 4,518,815 | 5/1985 | Yamazaki | 136/244 |

FOREIGN PATENT DOCUMENTS

| | | | |
|---|---|---|---|
| 57-12568A | 1/1982 | Japan | 29/572 |
| 57-176778A | 10/1982 | Japan | 29/572 |
| 58-18971 | 2/1983 | Japan | 136/244 |
| 58-196061A | 11/1983 | Japan | 136/258 AM |
| 59-3981A | 1/1984 | Japan | 29/572 |
| 59-34668A | 2/1984 | Japan | 427/39 |
| 59-35487A | 2/1984 | Japan | 136/244 |
| 59-35489A | 2/1984 | Japan | 136/244 |
| 59-35491A | 2/1984 | Japan | 136/244 |

OTHER PUBLICATIONS

S. Yamazaki et al. "Mask-less Fabrication of A-Si Solar Cell Using Laser Scribe Process", *IEEE Photovoltaic Specialist Conference*, May 1-3, 1984, pp 206-211.

Primary Examiner—Aaron Weisstuch
Attorney, Agent, or Firm—Burgess, Ryan and Wayne

[57] ABSTRACT

An insulating strip is disposed between a top or/and bottom electrode layer and a photosensitive semiconductor layer, particularly an amorphous semiconductor layer, so that even if a groove traversing the top electrode layer and/or the semiconductor layer is formed along the insulating strip by laser scribing and damage occurs in respective layers, the damage does not affect the performance of the integrated solar cells. Thus, incorporation of a laser scribing process for dividing a solar cell is made practically possible. Moreover, application of a laser welding process for series-connection of divided parts of a solar cell is made practically possible.

29 Claims, 13 Drawing Figures

INTEGRATED SOLAR CELLS

BACKGROUND OF THE INVENTION

1. Field of the Invention

The present invention relates to integrated solar cells, particularly amorphous silicon semiconductor solar cells formed on a flexible ribbon-like substrate.

2. Description of the Related Art

Amorphous silicon semiconductor layers have been widely studied for use as a semiconductor layer for a solar cell, since they can be deposited uniformly in a large area onto a substrate at a low temperature by glow discharge decomposition of silane gas or the like and since various substrates such as glass, polymer films, ceramic plates, and metal foils may be used. As a basic structure of an amorphous silicon solar cell, a laminate of a metal electrode layer/an amorphous silicon semiconductor layer/a transparent electrode layer formed on the above-mentioned various substrates is known.

It is easy to deposit an amorphous silicon layer onto a ribbon-like substrate having a metal electrode layer by utilizing the above-mentioned features of amorphous silicon film deposition and by using a roll-to-roll process disclosed in Japanese Unexamined Patent Publication (Kokai) No. 59-34668 and U.S. Pat. No. 4,438,723 or by a three-chamber separated formation process described in the *Japanese Journal of Applied Physics,* Vol. 21, No. 3, p. 413 (1982). It is also easy to form a transparent electrode layer onto the amorphous silicon semiconductor layer by depositing a transparent conductive oxide.

To use the resultant laminate as an electric power supply, provision of lead terminals to the metal electrode layer and the transparent electrode layer is necessary. Further, to obtain a higher output voltage necessary for practical use, division of the laminate or a solar cell into unit cells and series connection of the unit cells by electrically connecting a metal electrode layer of a unit cell to a transparent electrode layer of the neighboring unit cell are necessary, because the output voltage of such a solar cell is in a range of about 0.6 to 5 V irrespective of its area. In these cases, ordinarily, the metal electrode layer or the bottom electrode layer of the laminate is first exposed and then connected to the transparent electrode layer or the top layer of the laminate. To expose the metal electrode layer, the following processes are used or proposed.

(a) Use of a metal mask during deposition of the amorphous silicon layer (Kausche et al, U.S. Pat. No. 4,245,386).

(b) Removal of a part of the amorphous silicon layer by a wet or dry etching process after deposition of the amorphous silicon layer.

(c) Removal of a part of only the amorphous silicon layer by irradiation of a laser beam to melt and evaporate it after deposition of the amorphous silicon layer (S. Yamazaki et al, "Mask-Less Fabrication of a-Si Solar Cell Using Laser Scribe Process", *IEEE Photovoltaic Specialist Conference,* May 1984, pp 206–211).

Among the above processes, process (a) is not suitable for a roll-to-roll processing or a large area processing. Even in an amorphous silicon deposition process, process (a) does not give a good pattern and cannot easily expose partially the surface of the metal electrode layer in an electrically satisfactory state, because heating during deposition of the amorphous silicon prevents good contact between the substrate and the mask due to the difference of thermal expansion coefficients and as a result amorphous silicon is deposited in the space between the substrate and the mask. Further, it is difficult to control the deviation of alignment to within about 0.5 mm in mask-alignment.

Process (b) can be used by a combination of resist coating and etching, but is not suitable for manufacturing solar cells at a low cost in mass production because it needs many steps such as coating the resist, exposure, washing, and etching.

Moreover, integrated solar cells produced by the above-mentioned process (a) or (b) need a large area for a connection portion for connecting unit cells. This reduces the active area and thus area efficiency of the integrated solar cells.

Use of a laser beam to divide a laminate or a large solar cell into unit cells allows selection of the width of the groove dividing the cells in a range between several tens to several hundreds of micrometers by control of the optical system and allows accurate division into the unit cells in desired patterns by a computer control system having a program for the desired patterns. Further, by moving mirrors or optical glass fibers in an optical system, division of a solar cell on a wide, continuously running ribbon-like substrate is possible. Thus, process (c) allows good productivity in division of a solar cell.

We tried to use a laser beam to divide a solar cell. As a result, we found that the metal electrode layer was damaged by irradiation of a laser beam necessary for melting and evaporating the silicon layer on the metal layer, even when the metal electrode layer was of a high melting point metal. This phenomenon disturbed the electrical surface state of the metal electrode layer.

If the metal electrode layer was of a low melting point metal, selective removal of the silicon layer was impossible. Moreover, heat damage to the amorphous silicon layer occurred around the portion where the laser beam was irradiated. Particularly, we found by Raman spectrometry that crystallization of the amorphous silicon layer occurred there. If crystallization occurred in the silicon layer, the dark conductivity was increased at the crystallized portion and pin-type junctions at that portion were destroyed, resulting in disappearance of the rectification effect. The electromotive force generated in the solar cell was therefore lost in the crystallized portion after the laser scribing process. Furthermore, observation of a section of the divided portion with a scanning electron microscope revealed that the bottom metal electrode layer and the top transparent electrode layer were electrically joined by fusion thereof. This was also a cause of deterioration of the characteristics of the solar cell.

SUMMARY OF THE INVENTION

An object of the present invention is to eliminate the above-described problems of the prior art.

Another object of the present invention is to enable use of the mask-less dry process to divide a laminate or a large solar cell into smaller unit cells and to provide integrated solar cells by the use of laser processing, eliminating the problems in the laser scribing process in the prior art.

A further object of the present invention is to provide improved structures of interconnection between unit cells of integrated solar cells and thus to provide integrated solar cells having various advantages resulting from the structures.

The above and other objects are attained by providing integrated solar cells comprising a laminate of a bottom electrode layer, a photosensitive semiconductor layer, and a top electrode layer on a substrate and comprising a plurality of series-connected unit cells, at least the bottom and top electrode layers being divided to form the unit cells, the series-connection being made by electrically connecting a bottom electrode layer of a unit cell of the neighboring unit cells with a top electrode layer of the other unit cell of the neighboring unit cells, in which at least the top electrode layer or the semiconductor layer among the laminate has a laser-scribed groove in a designed pattern and an insulating strip is disposed between the top electrode layer and the semiconductor layer or/and between the bottom electrode layer and the semiconductor layer along the designed pattern.

In the integrated solar cells of the present invention, the insulating strip prevents damage of the respective component layers caused by laser beam irradiation and thus deterioration of the solar cells. Thus, the solar cells do not deteriorate even if a laser scribing process is used for dividing a solar cell. Further, use of an insulating strip especially which is of an opaque material to a laser beam facilitates selective cutting of the component layers; the entire laminate may be cut by a high power laser beam, and the layer or layers on or above the insulating strip may be cut by a low power laser beam. As a result, a laser scribing process can be used for production of the integrated solar cells without the troubles of the prior art.

In the above integrated solar cells, one of the top and bottom electrode layers, typically the top electrode layer, is ordinarily of a transparent electrically conductive material.

Integrated solar cells according to the present invention may have a series-connection structure between unit cells, in which the laminate of a bottom electrode layer, a photosensitive semiconductor layer, and a top electrode layer on a substrate is divided into unit cells by a first groove traversing at least the bottom electrode layer; there is a second groove traversing at least the top electrode layer but not the bottom electrode layer adjacent to and parallel with the first groove; and the top electrode layer and the bottom electrode layer are electrically connected to each other in a connection portion between the first and second grooves.

The first groove may traverse only the bottom electrode layer or the two layers of the bottom electrode layer and the semiconductor layer. These types of first grooves may allow elimination of an additional connection electrode, described later, for interconnection between neighboring unit cells.

The first groove may preferably traverse the entire laminate of the bottom electrode layer, the semiconductor layer, and the top electrode layer. This allows formation of the first and second grooves in the same step by selecting the irradiating power of the laser beam.

An insulating strip must be disposed between the bottom electrode layer and the semiconductor layer or/and between the top electrode layer and the semiconductor layer when the first groove made by a laser scribing process traverses the semiconductor layer.

The second groove should traverse the top electrode layer and may or may not penetrate into the semiconductor layer or even into the bottom electrode layer. However, the second groove should not traverse the bottom electrode layer entirely. Preferably, the second groove traverses only the top electrode layer. This can be easily attained according to the present invention by disposing an insulating strip opaque to a laser beam between the top electrode layer and the semiconductor layer along the second groove to be formed. This insulating strip further prevents deterioration of characteristics of the integrated solar cells even if irradiation of a laser beam damages the semiconductor layer near the second groove.

Interconnection between the top and bottom electrode layers in the connection portion between the first and second grooves may be done, for example, by making one or more grooves traversing from the top electrode layer to the bottom electrode layer in the connection portion and then filling the grooves with a conductive material. We also found that the interconnection between the top and bottom electrode layers can be attained by laser welding the entire laminate of the top electrode layer, the semiconductor layer, and the bottom electrode layer. Ohmic contact between the top and bottom electrode layers was obtained by laser welding in fact. Although we do not know the exact reasons why ohmic contact is attained, we suppose that, by fusion of the laminate, the amorphous silicon is crystallized and the metals of the electrode layers are dispersed mutually throughout the entire laminate in the welded portion, which decreases the electrical resistance there to give excellent ohmic contact. This interconnection by laser welding provides additional advantages to the present invention. That is, steps for exposing the bottom electrode layer are not necessary and, therefore, interconnection between the top and bottom electrode layers can be obtained in a simple dry process. Further, the width necessary for interconnection becomes smaller.

If the first groove traverses the entire laminate and thus the top electrode layer, a connection electrode is necessary for connecting the portions, divided by the first groove, of the top electrode layer to each other. Further, the top electrode layer is ordinarily a transparent electrically conductive electrode layer which does not have a high conductivity and, therefore, a collector electrode having a good conductivity is ordinarily necessary on the transparent electrode layer to efficiently collect current generated in cells. Thus, also according to the present invention, an additional electrode for interconnection between unit cells and collection of current generated in the unit cell is ordinarily formed in integrated solar cells. Such an electrode acting as a connection and collector electrode according to the present invention can be provided by deposition or coating thereof on the top electrode layer in order to bridge above the first groove between the divided portions of the top electrode layer. In a typical example, the connection and collector electrode is of a conductive material such as silver or aluminum and has a shape of a comb comprising a bar and teeth extending from the bar, the bar of the comb extending along the connecting portion between the first and second grooves, busbar electrode, and the teeth of the comb extending from the bar of the comb onto the unit cell neighboring the connection portion, finger electrodes.

To avoid short-circuits and current leakage in a groove formed in the laminate, such as a first or second groove mentioned above, by a conductive material which has fallen into the groove, an insulating material such as an insulating resin may be filled in the groove according to the present invention. In general, such a conductive material may make short-circuits between the bottom and top electrode layers or between opposite portions of the bottom or top electrode layer divided by the groove. An insulating material filled in the groove prevents such short-circuits and current leakage.

The present invention also provides a process for manufacturing integrated solar cells comprising a laminate of a bottom electrode layer, a photosensitive semiconductor layer, and a top electrode layer on a substrate and comprising a plurality of series-connected unit cells, the series-connection being made by electrically connecting a bottom electrode layer of a unit cell of neighboring unit cells with a top electrode layer of the other unit cell of the neighboring unit cells, the process comprising the steps of: preparing the substrate; forming the laminate on the substrate; disposing first and second insulating strips between the photosensitive semiconductor layer and the top or bottom electrode layer during the laminate forming step, the said first and second insulating strips having designated patterns; laser scribing the laminate in and along a pattern of the first insulating strip to form a first groove which divides the laminate into the unit cells; laser scribing the top electrode layer in and along a pattern of the second insulating strip to form a second groove which divides the top electrode layer in parallel with the first groove; filling the first and second grooves with an insulating material; forming, on the top electrode layer and the insulating material filled in the first groove, a connection and collector electrode having a shape of a comb comprising a bar and teeth extending from the bar, the bar portion of the connection and collector electrode residing on the top electrode layer between the first and second groove, the teeth portion of the connection and collector electrode extending from the bar portion onto the top electrode layer of the neighboring unit cell; laser welding the connection and collector electrode and the laminate between the first and second grooves to make ohmic contact between the connection and collector electrode and the bottom electrode layer there.

DESCRIPTION OF THE PREFERRED EMBODIMENTS

Figure 1A:
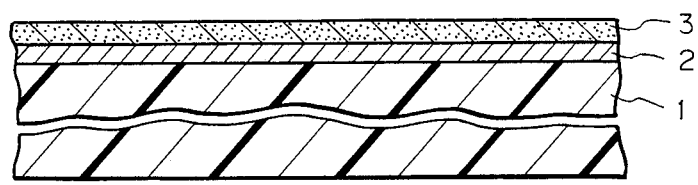
FIGS. 1A to 1F are sectional views of main steps of manufacturing integrated solar cells.

In integrated solar cells according to the present invention, a substrate may be any electrically insulating substrate, for example, a polymer film, ceramic sheet, glass sheet, or metal foil provided with an insulating layer thereon. Preferably, it is a polymer film in the form of a ribbon onto which component layers of a solar cell can be sequentially deposited during passage of the ribbon in a roll-to-roll process and which is suitable for mass production. Such a polymer film may be any one having the heat resistance necessary for deposition of the component layers. A polyethyleneterephthalate (PET) film, a polyethylenenaphthalate film (PEN), a polyimide film, a polyestersulphone film, a polyamide film, etc., which have excellent mechanical properties, are preferably used.

The bottom or top electrode layer may be a single or laminated layer, made of a metal such as aluminum (Al), silver (Ag), titanium (Ti), tungsten (W), cobalt (Co), chromium (Cr), and nickel (Ni), or an alloy such as nichrome and stainless steel.

A laminated layer of Al/stainless steel or, generally, a laminate layer of a metal layer such as Al or Ag having very high electrical conductivity and a refractory metal or alloy layer having a melting point of 1000° C. or more, is preferably used since it has a high light reflectance and makes good contact with a semiconductor layer. The thickness of the metal electrode layer is preferably 0.3 $\mu$m or more in order to reduce its electrical resistance and to ensure sufficient mechanical strength.

Ordinarily, one of the bottom and top electrode layers, typically the top electrode layer, is a transparent electrode layer, which may be any one of known materials. For example, indium oxide, tin oxide, cadmium stannate, indium tin oxide (ITO), or the like may be used as a single layer or a laminated layer. A laminate of a thin metal layer and a dielectric layer, such as $TiO_2$/Ag/$TiO_2$, may be also used.

A photosensitive semiconductor layer used in the present invention may be any one which has photovoltaic ability. An example is a known pin-type amorphous silicon photovoltaic layer which is made by plasma CVD using glow discharge decomposition of silane gas, disilane, etc. Here, a pin-type layer means a stack of a p-type doped layer, an intrinsic layer, and an n-type doped layer. The photovoltaic layer may have multilayered tandem structures such as pin/pin or pin/pin/pin and may incorporate a narrow or wide band gap semiconductor layer made of, e.g., amorphous silicon-germanium alloy, amorphous silicon carbide or non-single crystalline silicon, if desired. The present invention is particularly directed to a photosensitive layer comprising an amorphous semiconductor material but does not exclude a photosensitive layer of a crystalline semiconductor material from being used.

The insulating strip used in integrated solar cells according to the present invention should have a width larger than that of a laser-scribed groove in order to prevent formation of short-circuits and current leakage near the laser-scribed groove. The insulating strip has preferably a thickness in a range from 0.5 $\mu$m to 50 $\mu$m. Below 0.5 $\mu$m thickness, the formation of short-circuits and current leakage between the top and bottom electrode layers cannot be prevented. Above 50 $\mu$m thickness, the strip forms a step, making uniform deposition of the top electrode layer and/or formation of the connection electrode over the top electrode layer difficult.

As such an insulating strip, an insulating resin such as an epoxy resin, a polyimide resin, or a polyester resin is typically used.

Disposition of the insulating strip may be done, for example, by screen printing.

As described before, the insulating strip may be transparent or opaque to laser beam. A transparent strip is advantageous if layers on both sides of the strip should be cut, because the laser beam necessary for the cut can be weak (i.e., of low power). An opaque strip has an advantage in allowing selection of low or high power of the laser beam and thus selection of the depth of cut in the laminate irradiated with the laser beam. That is to say, only a layer or layers existing at one side of the opaque strip is or are cut if the laser beam has a low power density and layers at both sides of the opaque strip are cut if the laser beam has a high power density. Thus, an opaque strip allows selection of depth of cut by selection of power density of the laser beam. Moreover, an opaque strip basically makes it easy to form a groove having a designated depth in a laminate sandwiching the strip therein. Further, an opaque strip makes it easy to find a portion to be cut or irradiated with the laser beam. These are particularly advantageous in patterning and making a module of solar cells.

By using the optimum power density of the laser beam, a solar cell can be divided in desired patterns.

Any laser which generates light having a wavelength in a range of 0.2 to 2 $\mu$m may be used because the component layers of a solar cell are able to absorb effectively such a laser beam. An yttrium aluminum garnet (YAG) laser, used widely in industry, is preferable.

An additional connection electrode or collector electrode is ordinarily a conductive layer composed mainly of a metal such as gold, silver, copper, aluminum, or nickel or an alloy thereof. This connection electrode is formed on the top electrode layer by physical vapor deposition of matals, for example, vacuum evaporation, sputtering, etc., followed by patterning with use of a mask. In this case, the layer should preferably have a thickness of 0.5 $\mu$m or more. Alternatively, a connection electrode may be formed by chemical plating, etc. In this case, the thickness of the layer is similar to the above. Further, application of an electrically conductive resin containing Au, Ag, Cu, Al, or Ni powders by screen printing, etc. may be used and is preferable due to its capability of being used in a continuous process. The thickness of a printed conductive layer should be 5 $\mu$m or more for good electrical conductivity.

The laser or laser beam, which may be used for welding a laminate of a bottom electrode layer, a semiconductor layer, and a top electrode layer and, optionally, a connection electrode, to make ohmic contact between the bottom and top electrode layers or the connection electrode, is similar to the laser or laser beam for the scribing process mentioned before. The laser beam is ordinarily irradiated from above the top electrode layer or the connection electrode although it may be irradiated from the back side of a substrate if the substrate is transparent to the laser beam. The power density necessary for this welding and making an ohmic contact should be determined by experience because it depends on the irradiation orientation, the thickness of the electrode layers, etc. The power density of the laser beam should be selected in a range that melts bottom electrode layer, semiconductor layer, and top electrode layer and, if present, the connection electrode, though it is not necessary for the electrode layers and the connection electrode to be completely fused.

The insulating material to be filled into the groove may be any insulating material. Typically, an insulating resin such as an epoxy resin, polyamide resin, polyimide, and polyester resin may be used. Filling the groove with the insulating material may be done by a known method such as coating or screen printing. Screen printing is preferable due to its productivity. Though it is not necessary that the insulating material be completely filled in the groove, the insulating material is preferably filled in the groove and has a top surface approximately even with the top surface of the cells, in order to form a stable interconnection. In practical cases, the insulating material is preferably filled to have a difference of the level within 100 $\mu$m, more preferably within 50 $\mu$m, between the surface of the filled insulating layer and the surface of the cell.

In a preferred embodiment of the present invention, there is provided integrated solar cells in which a laminate of a top electrode layer, a photosensitive semiconductor layer, and a bottom electrode layer on a substrate, is divided into unit cells by a laser-scribed groove traversing the entire laminate; there is a second laser-scribed groove traversing the top electrode layer adjacent to and parallel with the first groove to form a connection portion between the first and second grooves for interconnecting both unit cells adjacent to the first and second grooves to each other; there is a connection electrode formed on the top electrode layer and bridging both sides of the first groove; and the connection electrode and the bottom electrode layer are connected in series with ohmic contact by laser welding in the connection portion. Of course, there are insulating strips between normally the top electrode layer and the semiconductor layer along the first and second grooves. Further, the first and second grooves are preferably filled with an insulating material.

In the above structure of the integrated solar cells, use of a laser scribing process reduces irradiation damage by a laser beam during patterning and as a result greatly increases the yield of effectively divided laminate. This is because of the need for just a single step of division after formation of all the component layers of the solar cells. On the other hand, in the prior art, damage to the component layers was often caused because several dividing steps were necessary after each component layer was formed. Further, because interconnection between unit cells is formed by laser welding in the connection portion formed between the first and second grooves, sufficient electrical connection is attained in a very small area, resulting in a large active area, that is, integrated solar cells having a large active area are obtained. Particularly, in the case of integrated solar cells using a collector electrode, we can use a bus bar of the collector electrode as the connection portion where laser welding is effected, and therefore we need no additional area for interconnection between unit cells, so that there is almost no reduction of the active area. In this case, formation of the second groove or the connection portion along the first groove, i.e., the groove dividing unit cells, is critical.

Formation of the connection electrode by screen printing allows a large increase of productivity and an increase of active area as solar cells.

Filling the groove with an insulating material allows the yield of dividing the solar cell laminate to be improved and width of the connection portion to be reduced.

The manufacture of the above example of integrated solar cells according to the present invention is described below with reference to FIGS. 1A to 1F, FIG. 2, and FIG. 3.

Referring to FIG. 1A, a bottom electrode layer 2, typically a metal layer is formed on a substrate 1, typically a polyethylene terephthalate (PET) ribbon. A photosensitive semiconductor layer 3, typically a pin-type amorphous silicon semiconductor layer, is then formed, for example, by the glow discharge method, on the bottom electrode layer 2.

Figure 1B:
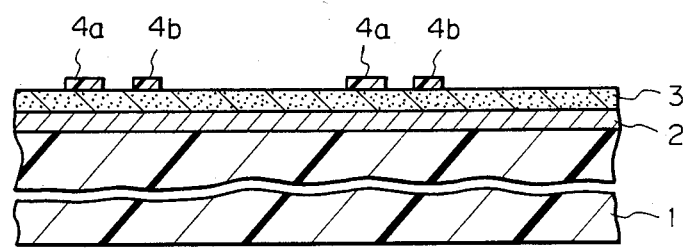
Figure 2:
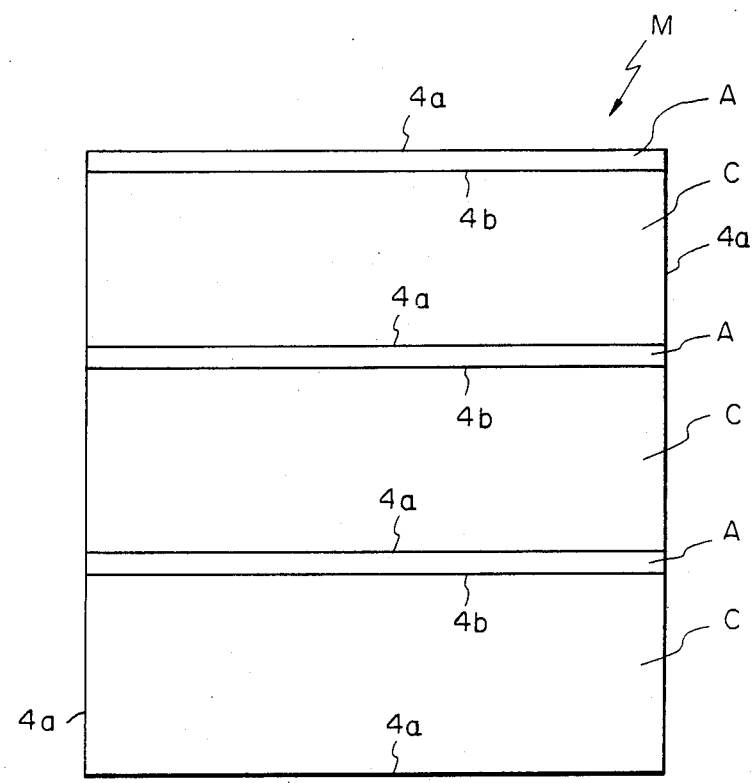
FIG. 2 is a plan view of patterns of laser scribing to form grooves in the integrated solar cells.

Referring to FIG. 1B and FIG. 2, insulating strips 4a and 4b, typically insulating resin strips, are formed on the semiconductor layer 3 with a designated pattern, for example, by screen printing. FIG. 2 shows an example of the pattern of the insulating strips for three units cells C divided from a square of 10 cm × 10 cm and to be series-connected to form an integrated module M. The pattern of the insulating strips is, of course, not limited to that shown in FIG. 2. Further, the insulating strips may be disposed between the bottom electrode layer 2 and the semiconductor layer 3 instead of between the top electrode layer and the semiconductor layer 3. The insulating strips 4a and 4b are preferably of the same material for one step printing and are opaque to a laser beam for selectively cutting only a top electrode layer formed on the strip or cutting the entire laminate of the bottom electrode layer 2, the semiconductor layer 3, and a top electrode layer.

Figure 1C:
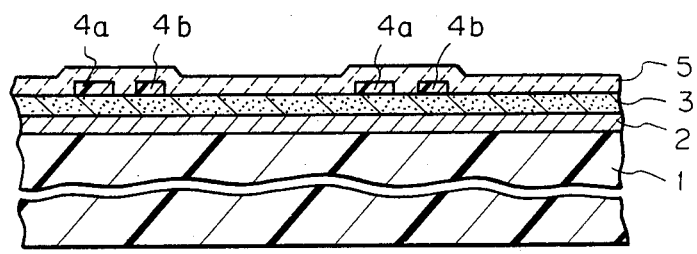

Referring to FIG. 1C, a top electrode layer 5, typically a transparent electrically conductive electrode layer, is formed uniformly over the semiconductor layer 3 and the insulating strips 4a and 4b.

Figure 1D:
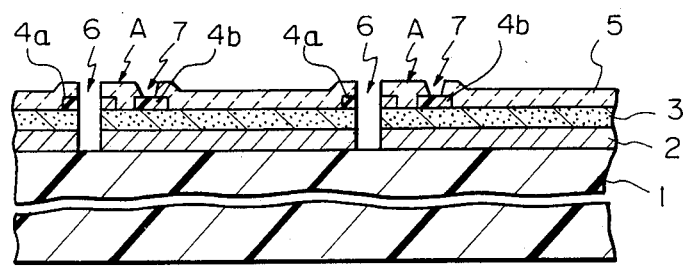

Referring to FIG. 1D, laser beams with calculated power densities are penetrated into and scanned along the insulating strips 4a and 4b respectively to form a groove 6 dividing the laminate 2, 3, and 5 into unit cells and a groove 7 dividing the top electrode layer 5 and consequently forming a connection portion A between the grooves 6 and 7. The groove 7 may not extend over the entire length of the groove 6.

Figure 1E:
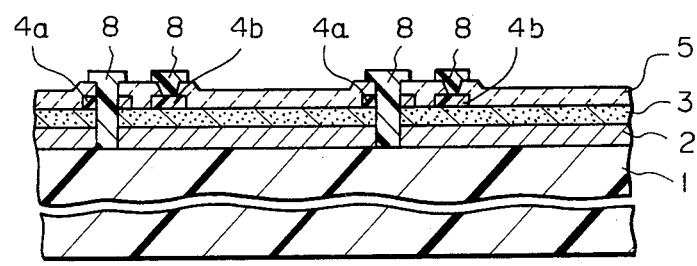

Referring to FIG. 1E, the grooves 6 and 7 are filled with an insulating material 8, typically an insulating resin, e.g., by screen printing. The insulating resin may be the same as the resin of the insulating strips 4a and 4b.

Figure 1F:
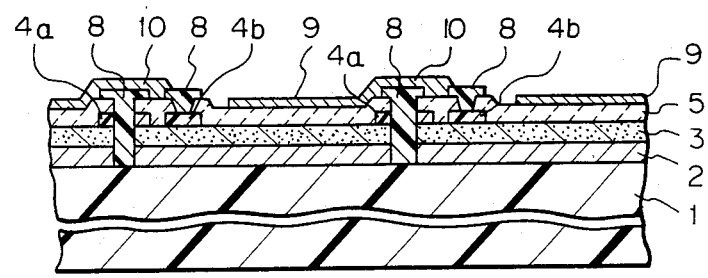
Figure 3:
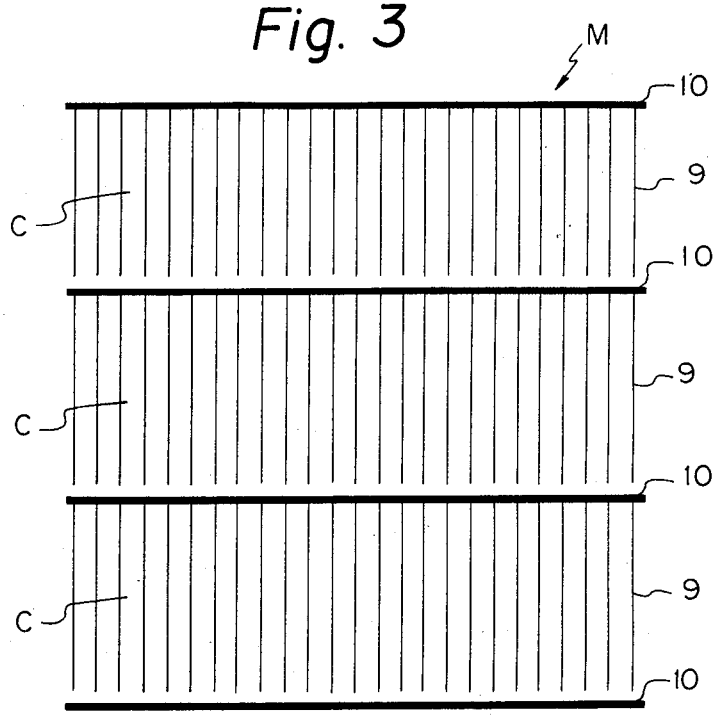
FIG. 3 is a plan view of patterns of a connection and collector electrodes in the integrated solar cells.

Referring to FIG. 1F and FIG. 3, a connection and collector electrode comprising a busbar portion 10 and a finger electrode portion 9 having a pattern as shown in FIG. 3 are formed on the top electrode layer 5. In this case, the bus bar portion 10 not only acts as a bus bar for the finger electrode portion 9 but also, optionally together with the finger electrode portion 9, connects the unit cell C and the connection portion A to each other. The bus bar portion 10 and finger electrode portion 9 are typically made of a conductive resin. Then, laser welding is carried out in the connection portion A between the grooves 6 and 7 filled with the insulating material 8 to form ohmic contact between the bus bar portion 10 and the bottom electrode layer 2, thus attaining electrical interconnection between neighboring unit cells. The laser welding may be spot welding or continuous linear welding.

Finally, the resultant integrated solar cells are covered by a resin coating to encapsulate them.

Each of the above steps may be conducted while a flexible ribbon-like substrate is transferred from a roll to another roll. Further, some or all of the above steps may be consecutively conducted while a flexible ribbon-like substrate is transferred from a roll to another roll.

EXAMPLE 1

Figure 4A:
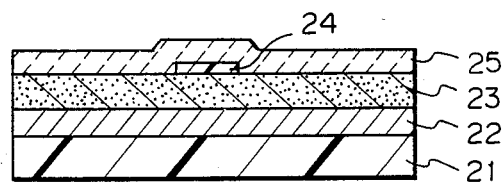
FIGS. 4A and 4B are sectional views of a solar cell and cells of Example 1 during manufacture thereof.
Figure 4B:
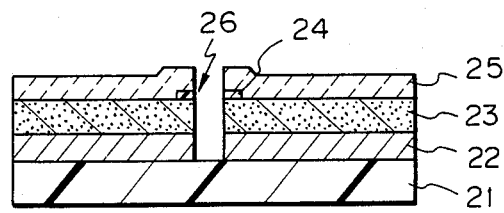

FIGS. 4A and 4B illustrate sections of amorphous silicon solar cells. In this example, PET film in the form of a ribbon was used as a substrate 21. The PET film ribbon may be used in a roll-to-roll process and is suitable for mass production. The PET film ribbon had a thickness of 100 μm.

The substrate 21 was placed in a DC magnetron sputtering apparatus. A metal bilayer consisting of an Al layer having a thickness of 0.5 μm and a stainless steel (SS) layer having a thickness of 1 nm to 30 nm was consecutively deposited onto the substrate 21 in an argon atmosphere having a pressure of the order of $10^{-3}$ Torr to form a metal electrode layer 22.

An amorphous silicon semiconductor layer 23 as a photovoltaic layer was a known pin-type structure and was formed on the metal electrode layer 22 by glow discharge decomposition of silane gas, etc., similar to the disclosure of Japanese Unexamined Patent Publication (Kokai) No. 59-34668. The pin-type amorphous silicon semiconductor layer 23 was formed by sequentially depositing, onto the metal electrode layer 22 formed on the substrate, a p-type boron (B)-doped layer in a thickness of 30 nm, an intrinsic layer in a thickness of 0.5 μm, and an n-type phosphorus (P)-doped layer in a thickness of 15 nm.

As an insulating strip disposed between the amorphous silicon semiconductor layer 23 and a subsequently deposited transparent electrode layer 25, an epoxy resin layer 24 was formed in a designated pattern for laser scribing and in a thickness of 15 μm on the amorphous silicon semiconductor layer 23 by screen printing.

An indium tin oxide (ITO) layer was deposited as a transparent electrode layer 25 in a thickness of about 60 nm on the amorphous silicon semiconductor layer 23 and the epoxy resin strip 24 by sputtering or electron beam evaporation. Thus, a solar cell having the structure PET//Al/SS//amorphous silicon pin//patterned epoxy resin//ITO as shown in FIG. 4A was obtained.

Then, the solar cell having the above-mentioned structure and having an area of 10 cm × 10 cm square was scanned with a laser beam from a YAG laser along the epoxy resin strip 24, and the irradiated portion of the solar cell was fused and evaporated to form a groove 26 extending from the transparent electrode layer 25 to the metal electrode layer 22, resulting in two cells each having a 5 cm × 10 cm rectangular shape. The YAG laser was a Q-switched pulse laser. The scanned laser beam had an average power of 0.8 W and a pulse frequency of 2 kHz and was scanned at a speed of 80 mm/sec.

Figure 5:
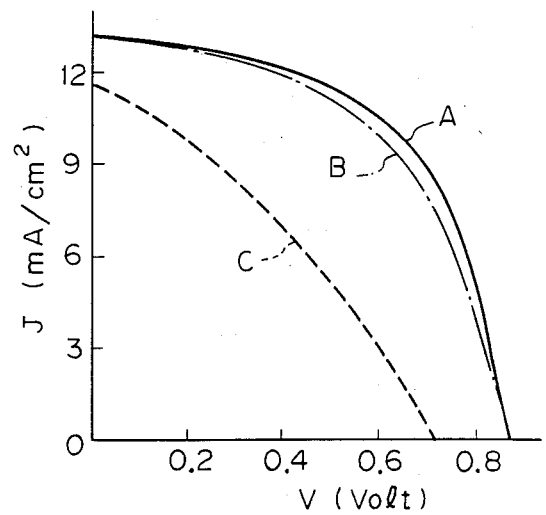
FIG. 5 is a graph showing voltage-current characteristics of solar cells in Example 1.

The current-voltage characteristics of the resultant 5 cm × 10 cm cells after division were measured and are shown as curve B in FIG. 5. In FIG. 5, the curve A shows the same characteristics of the 10 cm × 10 cm cell before division, and the curve C shows the same characteristics of 5 cm × 10 cm cells obtained by dividing a 10 cm × 10 cm cell, having the same structure as in Example 1 except that no epoxy resin strip 24 is disposed, by the same laser beam scanning as in Example 1.

From FIG. 5, it will be understood that the characteristics of solar cells according to the present invention were not reduced much at all even after division into two parts by the laser beam.

The solar cells of Example 1 according to the present invention were heated in air at 150° C. for 30 minutes after division into two parts of the cell. The resultant solar cells had almost the same characteristics as those of the curve A, which are the characteristics of a solar cell before division into two parts. Heat treatment fom 120° C. up to 200° C. gave similar results.

EXAMPLE 2

Figure 6:
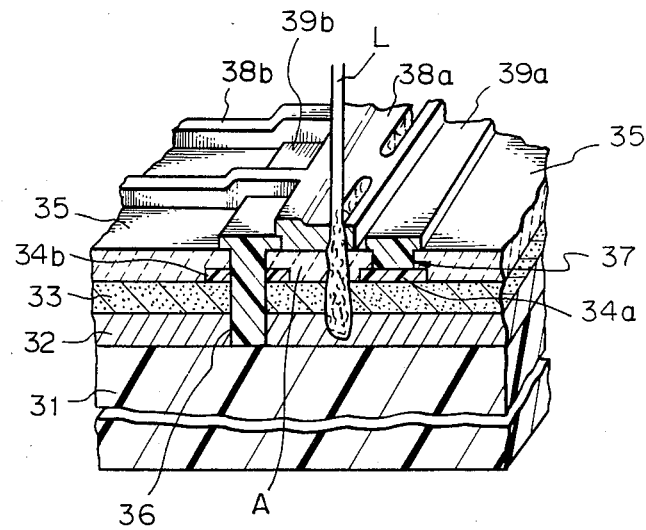
FIG. 6 is a perspective view of integrated solar cells in Example 2.

Referring to FIG. 6, a metal electrode layer 32, an amorphous silicon semiconductor layer 33, and a transparent electrode layer 35 were consecutively formed on a PET ribbon substrate 31 as in Example 1. However, the thicknesses, of the Al and SS layers of the metal electrode layer 32 were 0.5 μm and 10 nm respectively.

The semiconductor layer 33 had epoxy resin strips 34a and 34b disposed on it before the step of depositing the transparent electrode layer 35 so as to be placed between the layers 33 and 35. The epoxy resin strips 34a and 34b were black and opaque to a YAG laser beam and had a width of 1.0 mm and a thickness of 15 μm. The patterns of the epoxy resin strips 34a and 34b were made by screen printing and were similar to those of FIG. 2, that is, the patterns divided a 10 cm × 10 cm cell into three cells. The space between the strips 34a and 34b was 2.0 mm.

Laser scribing was carried out to form a first groove 36 for dividing the cell into unit cells and a second groove 37 for making the connection portion A. A YAG laser was used. The laser beam used was a Q-switched pulse type having a frequency of 2 kHz, a beam diameter of 100 μm, and a peak power of the laser pulse of 1 kW. The scanning speed was 3.2 cm/sec. The laser beam having a peak power of 1 kW was used to cut the entire laminate 32, 33, 34, and 35 and the laser beam having a peak power of 150 W was used to cut only the transparent electrode layer 35.

Thus, the cell was divided into three 3.3 cm × 10 cm cells. The width of the connection portion A or the space between the first and second grooves was about 2.0 mm.

Then, the insulating strips 39a and 39b of epoxy resin were disposed into the laser scribed grooves 36 and 37 by screen printing. The insulating strips 39a and 39b are comprised of the same material and patterns as those of the strips 34a and 34b. The width and thickness of the epoxy strips 39a and 39b were 2 mm and 12 μm, respectively. These strips 39a and 39b made it easy for the connection and collector electrode to bridge the unit cell C and the connection portion A without the generation of short-circuits.

After screen printing, a silver-resin paste was coated on the transparent electrode layer 35 in the following patterns and in a thickness of 13 μm by screen printing. The patterned silver-resin paste formed a connection and collector electrode 38 comprising a bus bar portion 38a and finger electrode portions 38b. The bus bar portion 38a extended along the connection portion A and the finger electrode portions 38b extended from the bus bar portion 38a onto the transparent electrode layer 35 of the divided unit cell. The bus bar portion 38a and the finger electrode portions 38b had widths of 1.0 mm and 0.2 mm, respectively.

Then, a laser beam L of the same conditions as those mentioned above except that the peak power of the laser pulse was 2 kW, was scanned on the bus bar portion 38a along the connection portion A. As a result, good ohmic contact between the bus bar portion 38a and the metal electrode layer 32 was obtained as seen in FIG. 6. This is clear from Table 1, which shows characteristics of a solar cell module of three series-connected cells resulting from the above. This measurement of the characteristics was conducted under a solar simulator having a power density of 100 mW/cm² and an air mass (AM) 1. For comparison, a solar cell module having the same components as those of this example, obtained by using mask processes for all steps, was measured. The results are also shown in Table 1.

TABLE 1

| Performance | Value | |
|---|---|---|
| | Invention | Comparison |
| Efficiency (%) | 5.7 | 5.3 |
| Open-circuit voltage (V) | 2.65 | 2.65 |
| Short-circuit current (mA/cm²) | 3.9 | 3.6 |
| Fill factor (%) | 55 | 55 |

From Table 1, it is seen that the module according to the present invention has an efficiency and a fill factor equivalent to those of the module by mask processes. This indicates that good division into two parts and good ohmic contact are attained in integrated type solar cells in which laser scribing and welding are used according to the present invention.

We were able to obtain cells having the same constitution as that of this example, even if a laser beam was irradiated from the back side of the PET film. In this case, a similar effect of laser welding could be attained except that the peak power of the laser pulse was 500 W with the other conditions being the same as above, because full fusion of the silver-resin layer of the bus bar portion 38a was not necessary.

EXAMPLE 3

Figure 7:
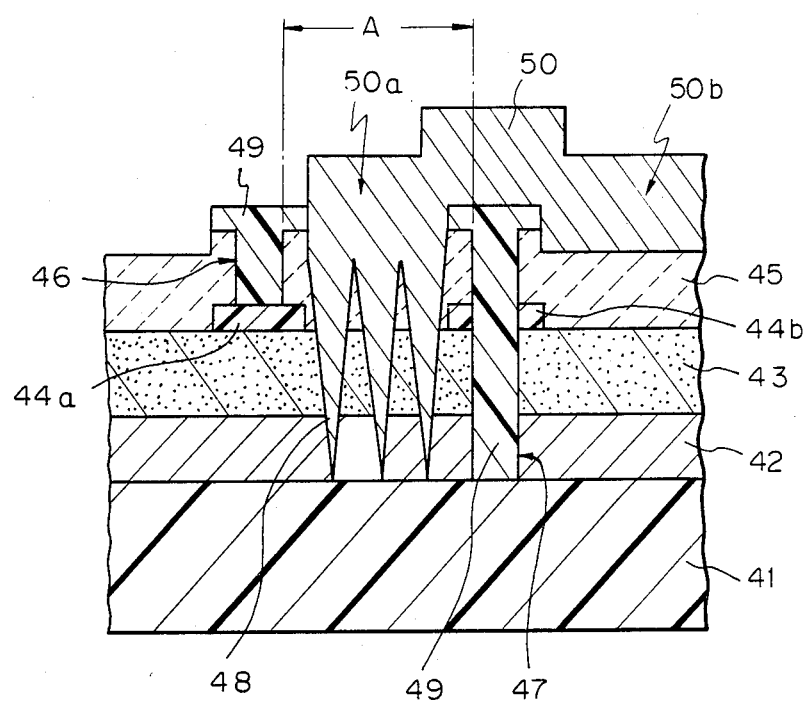
FIG. 7 is a sectional view of integrated solar cells in Example 3.

Referring to FIG. 7, a PET film substrate 41, an Al/SS metal electrode layer 42, a pin-type amorphous silicon photosensitive semiconductor layer 43, and a transparent electrode layer 45 were formed similar to Example 1. Epoxy resin strips 44a and 44b were formed similar to the corresponding parts of Example 2, except that the space between the strips 44a and 44b was 3.0 mm. First and second grooves 47 and 46 were made by laser scribing similar to Example 1, except that an average laser beam power of 0.8 W was used for opening the first groove 47 traversing from the transparent electrode layer 45 to the metal electrode layer 42 and an average laser beam power of 0.2 W was used for opening the second groove 46 traversing only the transparent electrode layer 45.

In this example, laser welding was not used for connecting the bottom and top electrode layers 42 and 45 in the connection portion A. In place of laser welding, a stainless steel knife was held against the top surface of the cell, pressed to the cell at a given contact pressure, and moved in a horizontal direction along the connection portion A or the first or second grooves 47 or 46. V-shape grooves 48 having a top width of about 100 μm and extending from the transparent electrode layer 45 to the metal electrode layer 42 were thus formed at a uniform density and the metal electrode layer 42 was exposed.

By using the same epoxy resin as that of the strips 44a and 44b and by screen printing it in given patterns and in a width and thickness of 1.0 mm and 10 μm, the first and second grooves 46 and 47 were filled with the epoxy resin 49.

A silver-resin paste was screen printed in patterns similar to those in Example 2 to form a connection and collector electrode 50 comprising a bus bar portion 50a and finger electrode portions 50b and to fill the V-shape grooves 48 with the silver-resin paste.

The performance of the resultant module of three series-connected solar cells was measured under a solar simulator at AM1 and 100 mW/cm². The results are shown in Table 2.

TABLE 2

| Performance | Value |
| --- | --- |
| Efficiency (%) | 6.07 |
| Open-circuit voltage (V) | 2.09 |
| Short-circuit current (mA) | 316.4 |
| Fill factor (%) | 56.0 |

For comparison, modules of three series-connected solar cells having the same constitution except that the grooves 46 and 47 were not filled with an epoxy resin were manufactured and measured under the solar simulator at AM1 and 100 mW/cm$^2$. As a result, there were some modules having an output voltage of zero. This was caused by short-circuits within the grooves 47.

EXAMPLE 4

This example was similar to Example 2 except that the first and second grooves were filled with the black polyester resin. The thickness of the insulating strips, of polyester, was 12 μm. The space between the polyester strips or the width of the connection portion was 2 mm. The peak power of a laser beam for cutting the transparent electrode layer was 200 W. The width and thickness of the polyester resin screen printed for filling the first and second grooves were 2 mm and 12 μm, respectively. The thickness of the connection and collector electrode was 15 μm.

The performance of the resultant module of three series-connected solar cells was measured under a solar simulator at AM1 and 100 mW/cm$^2$. The results are shown in Table 3.

TABLE 3

| Performance | Value |
| --- | --- |
| Active area (cm$^2$) | 78.5 |
| Efficiency (%) | 6.2 |
| Open-circuit voltage (V) | 2.68 |
| Short-circuit current (mA/cm$^2$) | 4.08 |
| Fill factor (%) | 56.7 |

We claim:

1. Integrated solar cells comprising a laminate of a bottom electrode layer, a photosensitive semiconductor layer, and a top electrode layer on a substrate and comprising a plurality of series-connected unit cells, at least said bottom and top electrode layers being divided to form said unit cells, the series-connection being made by electrically connecting a bottom electrode layer of a unit cell of neighboring unit cells with a top electrode layer of another unit cell of said neighboring unit cells, in which at least one of the top electrode layer and the semiconductor layer of the laminate has a laser-scribed groove in a designated pattern and an insulating strip is disposed at at least one of:
    (a) between the top electrode layer and the semiconductor layer and
    (b) between the bottom electrode layer and the semiconductor layer along said designated pattern.

2. Integrated solar cells according to claim 1, wherein said insulating strip has a thickness of 0.5 μm to 50 μm.

3. Integrated solar cells according to claim 1, wherein said insulating strip in opaque to a laser beam.

4. Integrated solar cells according to claim 3, wherein said opaque insulating strip is disposed between the top electrode electrode layer and the semiconductor layer and along and under a laser-scribed groove traversing the top electrode layer but not penetrating into the semiconductor layer.

5. Integrated solar cells according to claim 1, wherein said laser-scribed groove traverses the entire thickness of said laminate.

6. Integrated solar cells according to claim 1, wherein at least one of said bottom and top electrode layers is made of a transparent electrically conductive material.

7. Integrated solar cells according to claim 1, wherein said substrate is a flexible insulating ribbon.

8. Integrated solar cells according to claim 1, wherein said photosensitive semiconductor layer is of amorphous silicon.

9. Integrated solar cells according to claim 8, wherein said photosensitive semiconductor layer comprises p-, i-, and n-type amorphous silicon layers.

10. Integrated solar cells, comprising a laminate of a bottom electrode layer, a photosensitive semiconductor layer, and a top electrode layer on a substrate, in which said laminate has a first groove traversing the bottom electrode layer, the semiconductor layer and the top electrode layer to divide said laminate into unit cells and to electrically insulate the unit cells; each of the neighboring unit cells thus divided has a second groove adjacent to and in parallel spaced adjacency to said first groove and traversing at least the top electrode layer but not traversing the bottom electrode layer to form a connection portion having the same laminate structure as that of said laminate of the bottom electrode layer, the semiconductor layer and the top electrode layer being between said first and second grooves; and said top and bottom electrode layers in said connection portion being electrically connected to each other; and the top electrode layer of said connection portion are electrically connected to the top electrode layer of the other one of said neighboring unit cells through a connection electrode made on and bridging the respective top electrode layers thereof.

11. Integrated solar cells according to claim 10, wherein said connection electrode is made of gold, silver, copper, aluminum, or nickel, or an alloy thereof, or an electrically conductive resin.

12. Integrated solar cells according to claim 10, wherein said connection electrode has a shape of a comb comprising a bar and teeth extending from the bar, the bar of the comb extending along the connection portion and the teeth of the comb extending from the bar of the comb onto the top electrode layer of the unit cell.

13. Integrated solar cells according to claim 12, wherein said electrical connection between the top and bottom electrode layers in said connection portion is made by laser welding the laminate and the connection electrode along said bar of said comb.

14. Integrated solar cells according to claim 10, wherein said first groove is a laser-scribed groove.

15. Integrated solar cells according to claim 14, wherein said second groove is a laser-scribed groove.

16. Integrated solar cells according to claim 10, wherein said electrical connection between the top and bottom electrode layers in said connection portion is made by laser welding of the laminate in said connection portion.

17. Integrated solar cells according to claim 10, wherein said photosensitive semiconductor layer is of amorphous silicon.

18. Integrated solar cells according to claim 17, wherein said photosensitive semiconductor layer comprises p-, i-, and n-type amorphous silicon layers.

19. Integrated solar cells according to claim 10, wherein said substrate is a flexible insulating ribbon.

20. Integrated solar cells comprising a laminate of a bottom electrode layer, a photosensitive semiconductor layer, and a top electrode layer on a substrate, in which said laminate has a first laser-scribed groove traversing the bottom electrode layer, the semiconductor layer and the top electrode layer to divide said laminate into unit cells; each of the neighboring unit cells thus divided has a second laser-scribed groove adjacent to and in parallel spaced adjacency to said first groove and traversing at least the top electrode layer but not traversing the bottom electrode layer to form a connection portion having the same laminate structure as that of said laminate of the bottom electrode layer, the semiconductor layer and the top electrode layer being between said first and second grooves; and said top and bottom electrode layers in said connection portion are electrically connected to each other, the top electrode layer of said connection portion being electrically connected to the top electrode layer of the other one of said neighboring unit cells through a connection electrode made on and bridging the respective top electrode layers thereof; and insulating strips are disposed at at least one of:
(a) between the top electrode layer and the semiconductor layer and
(b) between the bottom electrode layer and the semiconductor layer along said first and second laser-scribed grooves, respectively.

21. Integrated solar cells comprising a laminate of a bottom electrode layer, a photosensitive semiconductor layer, and a top electrode layer on a substrate, in which said laminate has a first groove traversing the bottom electrode layer, the semiconductor layer and the top electrode layer to divide said laminate into unit cells and to electrically insulate the unit cells; each of the neighboring unit cells thus divided has a second groove adjacent to and in parallel spaced adjacency to said first groove and traversing at least the top electrode layer but not traversing the bottom electrode layer to form a connection portion having the same laminate structure as that of said laminate of the bottom electrode layer, the semiconductor layer and the top electrode layer being between said first and second grooves; said top and bottom electrode layers in said connection portion are electrically connected to each other, the top electrode layer of said connection portion being electrically connected to the top electrode layer of the other one of said neighboring unit cells through a connection electrode made on and bridging the respective top electrode layers thereof; and said first and second grooves are filled with an insulating material.

22. A process for manufacturing integrated solar cells comprising a laminate of a bottom electrode layer, a photosensitive semiconductor layer, and a top electrode layer on a substrate and comprising a plurality of series-connected unit cells, the series-connection being made by electrically connecting a bottom electrode layer of a unit cell of neighboring unit cells with a top electrode layer of the other unit cell of said neighboring unit cells, said process comprising the steps of:
preparing said substrate;
forming said laminate on said substrate;
disposing first and second insulating strips between said photosensitive semiconductor layer and said top or bottom electrode layer during said laminate forming step, said first and second insulating strips having designated patterns;
laser scribing said laminate in and along the pattern of said first insulating strip to form a first groove cutting said laminate into said unit cells;
laser scribing said top electrode layer in and along said pattern of said second insulating strip to form a second groove cutting said top electrode layer in parallel with said first groove;
filling said first and second grooves with an insulating material;
forming, on said top electrode layer and said insulating material filled in said first groove, a connection and collector electrode having a shape of a comb comprising a bar and teeth extending from the bar, the bar portion of said connection and collector electrode residing on said top electrode layer between said first and second groove, the teeth portion of said connection and collector electrode extending from said bar portion onto said top electrode layer of the neighboring unit cell;
laser welding said connection and collector electrode and said laminate between said first and second grooves to make ohmic contact between said connection and collector electrode and said bottom electrode layer there.

23. A process according to claim 22, wherein said first and second insulating strips are formed by screen printing.

24. A process according to claim 22, wherein said insulating material is screen printed to fill said first and second grooves.

25. A process according to claim 22, wherein said connection and collector electrode is formed by screen printing.

26. A process according to claim 22, wherein said substrate is a flexible insulating ribbon.

27. A process according to claim 26, wherein each of said steps is conducted while said flexible insulating ribbon is transferred from a roll to another roll.

28. A process according to claim 26, wherein said photosensitive semiconductor layer comprises a plurality of amorphous silicon layers and said plurality of amorphous silicon layers are consecutively formed while said flexible insulating ribbon is transferred from a roll to another roll.

29. A process according to claim 26, wherein at least two of said steps are consecutively conducted while said flexible insulating ribbon is transferred from one roll to another roll.

* * * * *